United States Patent
Chen et al.

(10) Patent No.: US 10,636,458 B2
(45) Date of Patent: *Apr. 28, 2020

(54) SENSE AMPLIFIER LAYOUT FOR FINFET TECHNOLOGY

(71) Applicant: Taiwan Semiconductor Manufacturing Co., Ltd., Hsin-Chu (TW)

(72) Inventors: Yen-Huei Chen, Jhudong Township (CN); Chien Chi Linus Tien, Hsinchu (TW); Kao-Cheng Lin, Taipei (TW); Jung-Hsuan Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,894

(22) Filed: Jul. 23, 2018

(65) Prior Publication Data

US 2018/0330765 A1    Nov. 15, 2018

Related U.S. Application Data

(63) Continuation of application No. 15/289,351, filed on Oct. 10, 2016, now Pat. No. 10,032,490, which is a
(Continued)

(51) Int. Cl.
*H01L 23/28* (2006.01)
*G11C 7/06* (2006.01)
(Continued)

(52) U.S. Cl.
CPC ............ *G11C 7/065* (2013.01); *G11C 11/419* (2013.01); *H01L 21/28008* (2013.01);
(Continued)

(58) Field of Classification Search
CPC ............ G11C 11/419; H01L 21/28008; H01L 21/823431; H01L 21/823475;
(Continued)

(56) References Cited

U.S. PATENT DOCUMENTS

| | | | |
|---|---|---|---|
| 4,904,888 | A | 2/1990 | Yamauchi |
| 5,389,810 | A | 2/1995 | Agata |

(Continued)

FOREIGN PATENT DOCUMENTS

| | | |
|---|---|---|
| KR | 10-2007-0036214 | 4/2007 |
| KR | 10-2012-0121365 | 11/2012 |

OTHER PUBLICATIONS

Official Action dated Dec. 29, 2015 in counterpart Korean Patent Application No. 10-2013-0147445.
(Continued)

*Primary Examiner* — Dinh T Le
(74) *Attorney, Agent, or Firm* — Duane Morris LLP

(57) ABSTRACT

A sense amplifier (SA) comprises a semiconductor substrate having an oxide definition (OD) region, a pair of SA sensing devices, a SA enabling device, and a sense amplifier enabling signal (SAE) line for carrying an SAE signal. The pair of SA sensing devices have the same poly gate length Lg as the SA enabling device, and they all share the same OD region. When enabled, the SAE signal turns on the SA enabling device to discharge one of the pair of SA sensing devices for data read from the sense amplifier.

20 Claims, 9 Drawing Sheets

Related U.S. Application Data continuation of application No. 13/939,201, filed on Jul. 11, 2013, now Pat. No. 9,466,493.

(51) Int. Cl.

| | | |
|---|---|---|
| *H01L 21/28* | (2006.01) | |
| *G11C 11/419* | (2006.01) | |
| *H01L 21/8234* | (2006.01) | |
| *H01L 23/528* | (2006.01) | |
| *H01L 23/552* | (2006.01) | |
| *H01L 27/02* | (2006.01) | |
| *H01L 27/088* | (2006.01) | |
| *H01L 27/11* | (2006.01) | |
| *H01L 29/06* | (2006.01) | |
| *H01L 21/20* | (2006.01) | |
| *H01L 27/092* | (2006.01) | |

(52) U.S. Cl.
CPC ........ *H01L 21/823431* (2013.01); *H01L 21/823475* (2013.01); *H01L 23/528* (2013.01); *H01L 23/552* (2013.01); *H01L 27/0207* (2013.01); *H01L 27/0296* (2013.01); *H01L 27/0886* (2013.01); *H01L 27/1104* (2013.01); *H01L 29/0649* (2013.01); *H01L 21/20* (2013.01); *H01L 21/2003* (2013.01); *H01L 27/0924* (2013.01)

(58) Field of Classification Search
CPC . H01L 23/528; H01L 23/552; H01L 27/0207; H01L 27/0296; H01L 27/0886; H01L 27/1104; H01L 21/20; H01L 27/00924
See application file for complete search history.

(56) References Cited

U.S. PATENT DOCUMENTS

| | | | |
|---|---|---|---|
| 5,859,805 A * | 1/1999 | Takashima | G11C 7/065 257/E27.084 |
| 6,297,682 B1 | 10/2001 | Morishima | |
| 6,304,479 B1 | 10/2001 | Vollrath et al. | |
| 7,257,015 B2 * | 8/2007 | Ohsawa | G11C 7/02 257/347 |
| 8,213,211 B2 | 7/2012 | Kurjanowicz | |
| 8,488,359 B2 | 7/2013 | Chung | |
| 8,536,898 B2 | 9/2013 | Rennie et al. | |
| 8,804,406 B2 | 8/2014 | Rachamadugu et al. | |
| 8,953,399 B2 | 2/2015 | Ferrant et al. | |
| 9,209,192 B2 * | 12/2015 | Kadoya | H01L 21/76895 |
| 9,240,221 B2 | 1/2016 | Terada | |
| 2001/0048620 A1 | 12/2001 | Fischer et al. | |
| 2011/0298496 A1 | 12/2011 | Rennie et al. | |
| 2012/0275254 A1 | 11/2012 | Ferrant et al. | |

OTHER PUBLICATIONS

Official Action dated Jun. 27, 2016 in counterpart Chinese Patent Application No. 2014102817661.

* cited by examiner

US 10,636,458 B2

SENSE AMPLIFIER LAYOUT FOR FINFET TECHNOLOGY

RELATED APPLICATIONS

This application is a Continuation of U.S. patent application Ser. No. 15/289,351, filed Oct. 10, 2016, which is a continuation of U.S. patent application Ser. No. 13/939,201, filed Jul. 11, 2013, which are incorporated by reference herein in their entireties.

BACKGROUND

In the rapidly advancing semiconductor manufacturing industry, complementary metal oxide semiconductor (CMOS) FinFET devices are favored for many logic and other applications and are integrated into various different types of semiconductor devices. FinFET devices typically include semiconductor fins with high aspect ratios formed vertically with respect to a top surface of the substrate, and in which channel and source/drain regions of semiconductor transistor devices are formed. The fins are isolated, raised structures. A gate is formed over and along the sides of the fins, utilizing the advantage of the increased surface area of the channel and source/drain regions to produce faster, more reliable and better-controlled semiconductor transistor devices. One important advantage of FinFET technology is that the mismatch between the devices is significantly lower than that under conventional manufacturing processes.

A semiconductor memory chip such as static random-access memory (SRAM) includes a sense amplifier, wherein the sense amplifier is part of the read circuitry used to read data from the memory chip. The sense amplifier discriminates small differential signal to large signal (rail-to-rail signal) in order to sense the logic levels from a bitline pair (bitline and bitline bar), which represents a data bit (1 or 0) stored in a memory cell. The sense amplifier amplifies the small voltage swing to recognizable logic levels so that data can be interpreted properly at the output terminal of the memory cell.

The device mismatch of the sense amplifier affects how large the differential signal voltage can be sensed by the sense amplifier sensing (also referred to as sensing read margin, sensing margin also defined as minimum required differential voltage for a given sense amplifier).

DETAILED DESCRIPTION

Figure 1:
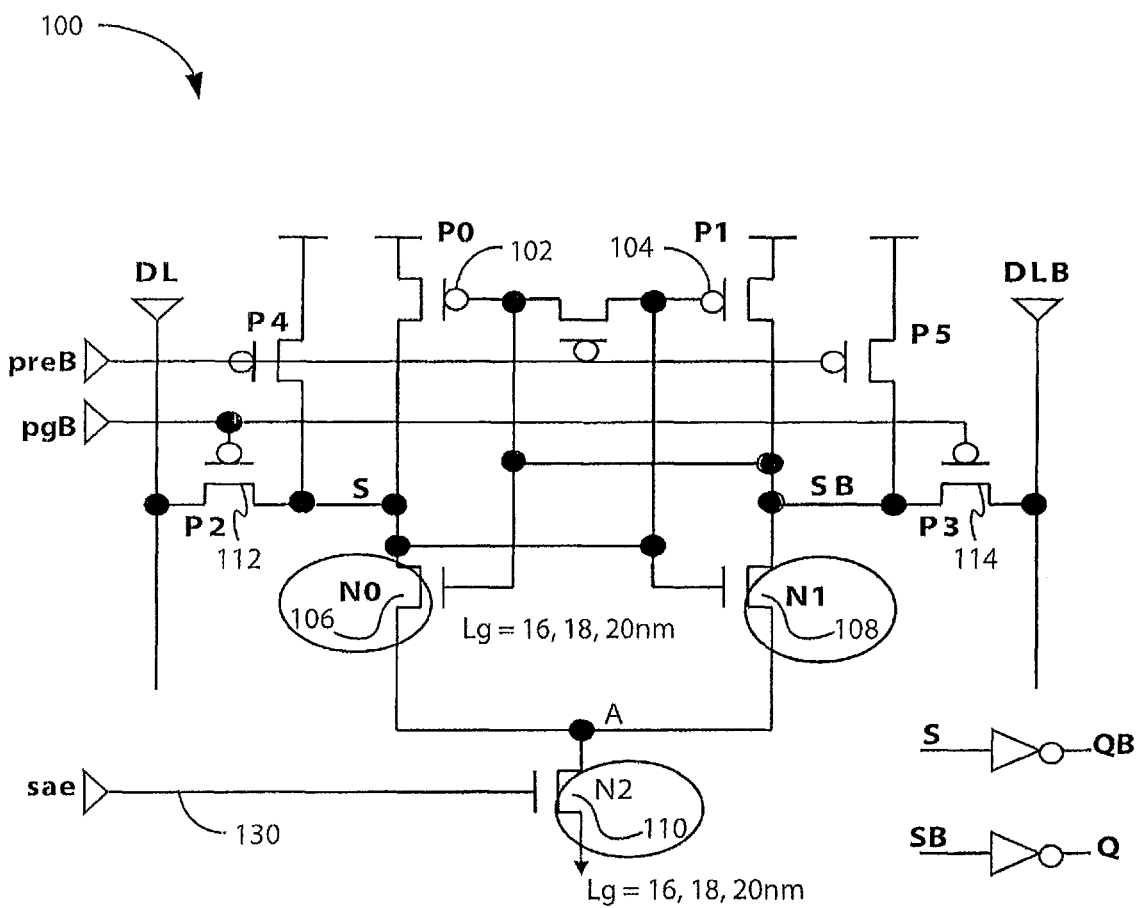
FIG. 1 shows a schematic view of an example of an embodiment of a sense amplifier having the same Lg for all of its devices, which share a common OD region.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A sense amplifier design can have a long channel length for sensing devices in order to improve the device mismatch and offset voltage of the sense-amplifier, which leads to long and different poly gate lengths (Lg) for various devices in the sense amplifier. Such devices with different poly gate lengths are placed in different oxide definition layers/regions (OD). The separate OD regions are used to provide isolation among different kinds of devices in the sense amplifier.

The inventors have discovered that a uniform poly gate length Lg (e.g., 16, 18 or 20 nm) for all NMOS devices can be adopted for a laying out and fabricating a sense amplifier manufactured using a FinFET process. Due to the low device mismatch under the FinFET process (as will be discussed in detail below), long channel length is not required to reduce mismatch between the devices, making it possible for all devices/transistors used in the sense amplifier to have the same nominal (short) gate length. Under such uniform nominal gate length, all devices used in the sense amplifier can share one common oxide definition (OD) layer/region instead of separate OD regions for different kinds of devices in the layout of the sense amplifier. An OD region defines an active area of the substrate. An integrated circuit (IC) typically includes a plurality of such OD regions, each located between a pair of isolation regions such as shallow trench isolation regions. In embodiments described herein, plural sensing devices (transistors) of a sensing amplifier are formed within a single OD region.

As a result of using a shared OD region layout, the layout area of the sense amplifier can be significantly reduced compared to the layout of a sense amplifier where different OD regions are used for different devices/transistors.

Figure 3A:
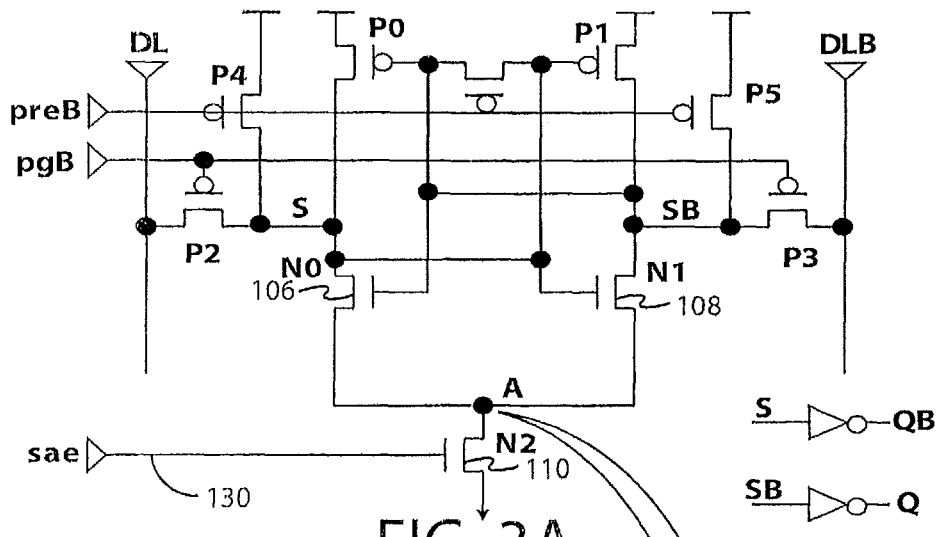
FIGS. 3A-C show the schematic view, the expanded plan view, and the cross section views of the layout of the NMOS devices in the sense amplifier, respectively.
Figure 5A:
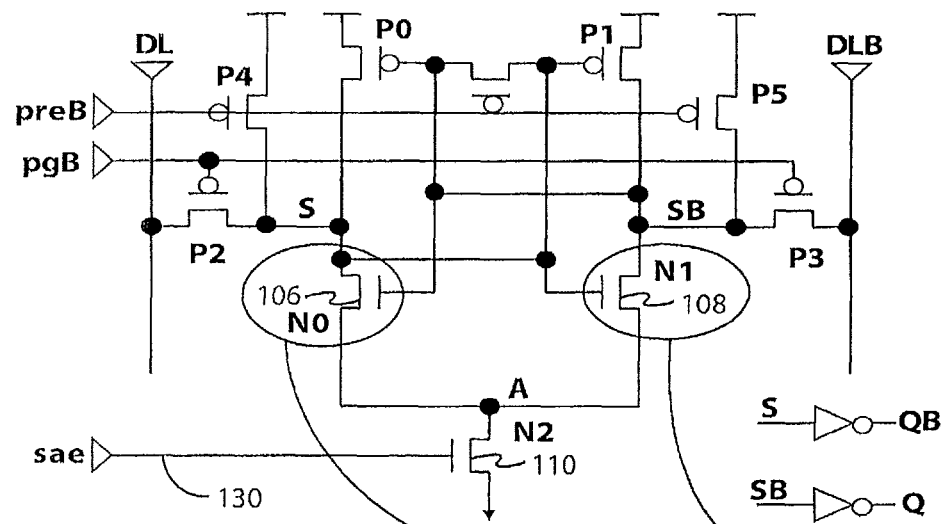
FIGS. 5A-B show examples of the schematic view and the plan view of the layout of the sensing devices of the sense amplifier, respectively.
Figure 6A:
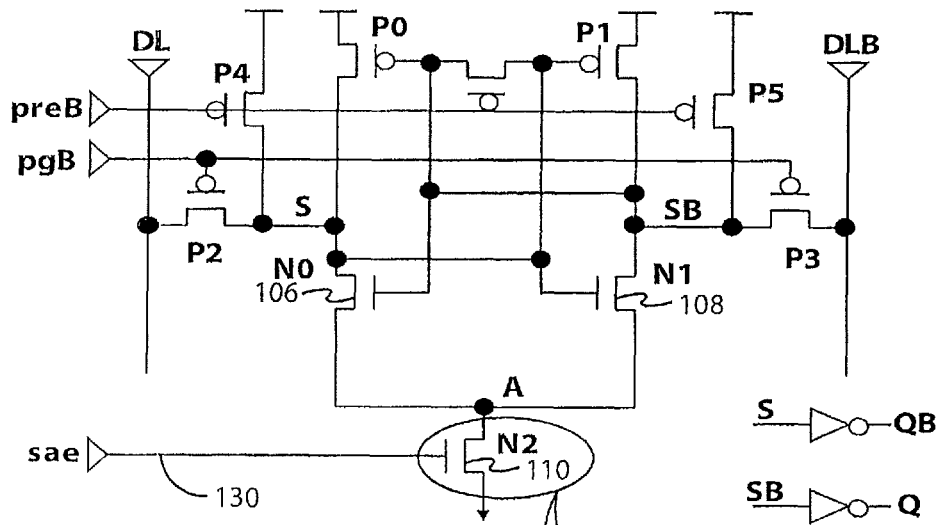
FIGS. 6A-B show examples of the schematic view and the plan view of the layout of the SA enabling device of the sense amplifier.

FIG. 1 shows a schematic view of an example of an embodiment of a sense amplifier 100 having an uniform Lg for all of its devices, which share a common OD region, wherein the schematic view is also shown in FIGS. 3A, 5A, and 6A.

As shown in the example of FIG. 1, the basic structure of sense amplifier (SA) 100 includes at least PMOS devices P0

(102), P1 (104), SA sensing devices N0 (106),and N1(108) and an SA enabling NMOS device N2 (110). The differential signals DL and DLB are propagated through P2 (112) and P3 (114), respectively, into the internal nodes S and SB of the sense amplifier, respectively. Once the sense amplifier enabling signal (SAE) carried by SAE line 118 is ON (goes from low to high), SA enabling device N2 (110) is enabled, which leads either SA sensing device N0 (106) or N1 (108) to discharge internal node S or SB, respectively, depending upon which internal node has a lower voltage level. For a non-limiting example, if voltage of node S is at 0.7V, which is lower than the voltage of node SB at 0.8V, then node S will be discharged by N0 (106) and N2 (110) to ground, resulting in a read of bit data "0" at S node (become a full swing signal) and propagate to QB. The opposite node SB still keep at high voltage level, so the Q signal will remain at "0" state.

In some embodiments, there can be a device mismatch between the two SA sensing devices. The differential voltage for sense amplifier 100 to operate properly is significantly impacted by the mismatch of voltages at sensing devices N0 (106) and N1 (108). If there is a device mismatch between the two SA sensing devices, for a non-limiting example, the voltage of N1 (108) is less than the voltage of N0 (106) by 200 mV, meaning that the strength of N1 (108) is stronger than N0 (106), N1 (108) will pull down node SB faster than node S. That is, node SB will be discharged instead of node S, causing an incorrect read data value of "1" at S node (S node kept at high, while SB node discharged to ground).

Figure 2A:
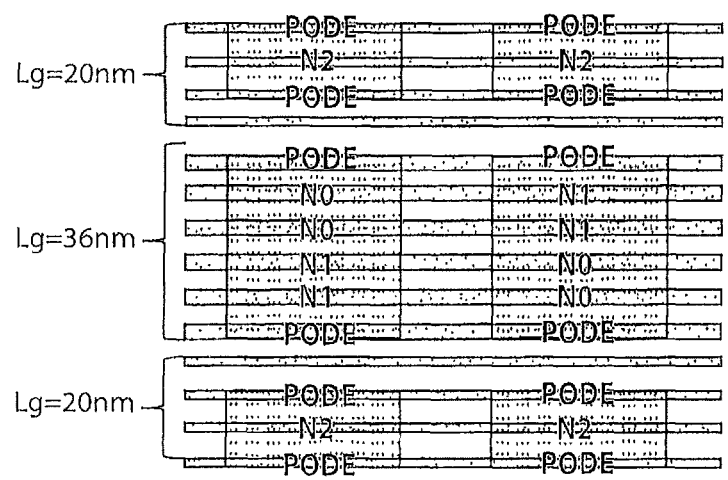
FIGS. 2A-B show examples of the plan views of the layout under separated OD regions and shared OD region for the NMOS devices in the sense amplifier of FIG. 1, respectively.
Figure 2B:
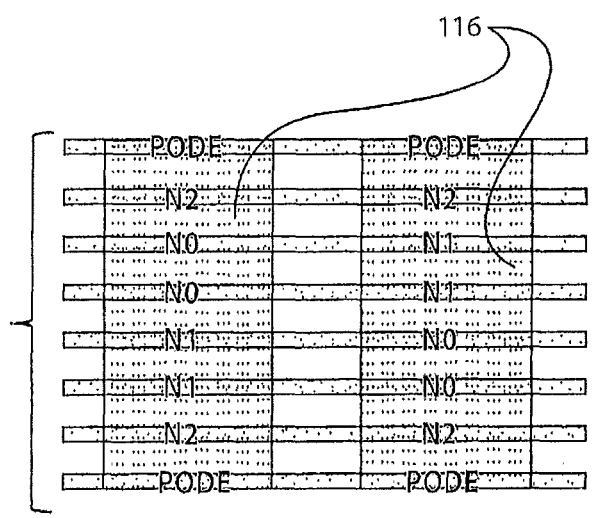

Due to significantly reduced mismatch between the devices when FinFET technology is used, long channel lengths are not required for the reduction of mismatch among the devices in sense amplifier 100 manufactured using FinFET technology. As a result, all NMOS devices N0 (106), N1 (108), and N2 (110) can have the same uniform (short) poly gate length Lg. As shown in the example of FIG. 1, the Lg of devices N0 (106) and N1 (108) can be aligned to N2 (110) so that they all have the same nominal Lg, which for non-limiting examples, can be 16, 18, or 20 nm. Since the same Lg is adopted for all of N0 (106), N1 (108), and N2 (110), they can all share the same common OD region under the design rule (whereas other sense amplifiers having different gate lengths have to use multiple OD regions, according to the design rule). FIG. 2B shows an example of a plan view of the layout of the shared OD region 116 for the NMOS devices N0 (106), N1 (108), and N2 (110) in FIG. 1. Compared to a layout of FIG. 2A in which N0 (106) and N1 (108) have a much larger Lg (e.g., Lg at 36 nm) than N2 (110) (e.g., Lg=20 nm) and thus have separate OD regions for the devices, the size of sense amplifier 100 in FIG. 2B (having the shared OD region 116) can be much smaller. For a non-limiting example, in some embodiments according to FIG. 2B, all of the gate lengths are 20 nm. In some embodiments according to FIG. 2B, all of the gate lengths are 18 nm. In other embodiments according to FIG. 2B, all of the gate lengths are 16 nm.

Figure 3B:
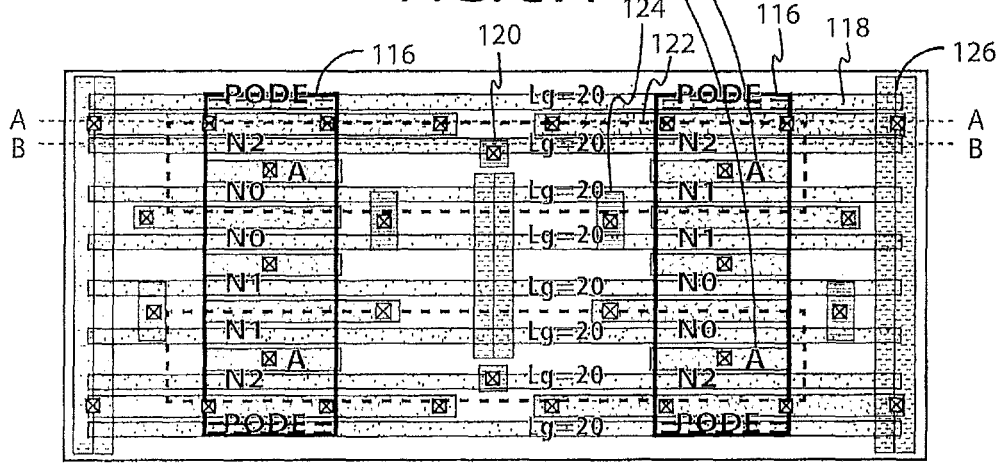
Figure 3C:
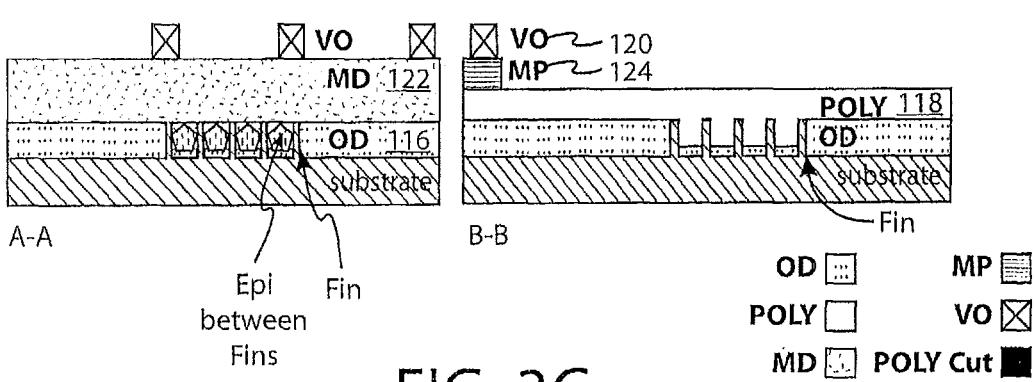

FIG. 3B shows an expanded plan view of the layout of the NMOS devices N0 (106), N1 (108), and N2 (110) in the sense amplifier. FIG. 3C shows cross section views of the of the NMOS devices taken across section lines A-A and B-B, respectively. As referred to hereinafter, OD refers to the shared OD region 116 marked by the box), POLY refers to the polycrystalline silicon definition layer 118 (at the level of the gate electrode layer), V0 refer to via 0 layer 120, MD refers to contact 122 between OD layer 116 and V0 120, MP refers to contact 124 between POLY 118 and V0 120, and POLY-Cut refers to cut poly layer 126 (which can be a photoresist layer which acts as a mask for forming poly lines).

As shown by the expanded ("unfolded") view in FIG. 3B (as well as FIGS. 5-8), each of the NMOS devices N0 (106), N1 (108), and N2 (110) is laid out in parallel in multiple components, wherein the components of each of the devices are connected together to form the sense amplifier through metal contacts and vias between different metal layers of the interconnect structure of the IC (not shown).

As shown in the example of FIG. 3B, the shared node A between N0 (106) and N2 (110) and between N1 (108) and N2 (110) can be connected to each other through the shared OD region instead of using metal line connection as in a sense amplifier layout in which separate OD layers/regions are adopted for the NMOS devices.

Figure 4A:
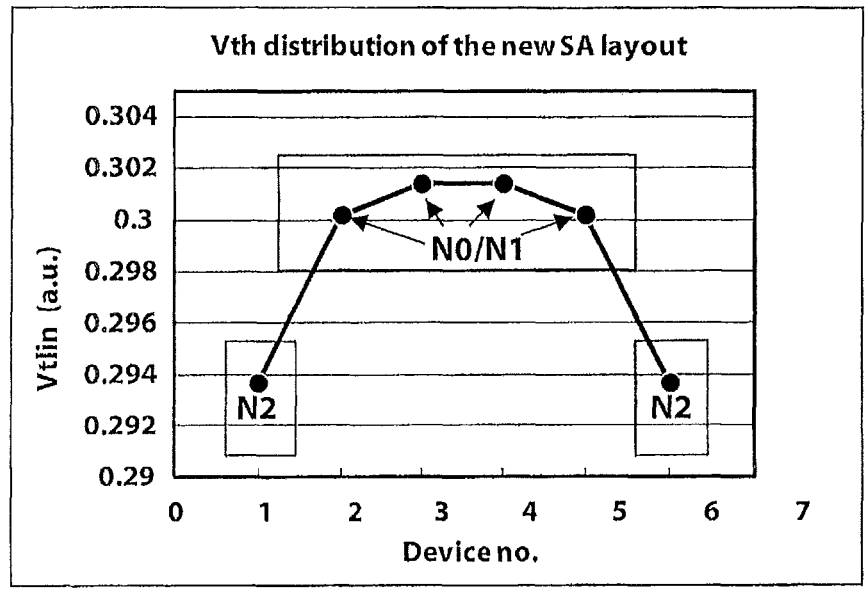
FIGS. 4A-B show threshold voltage Vt distribution across layout of the sense amplifier and the corresponding layout positions for the sensing devices, respectively.
Figure 4B:
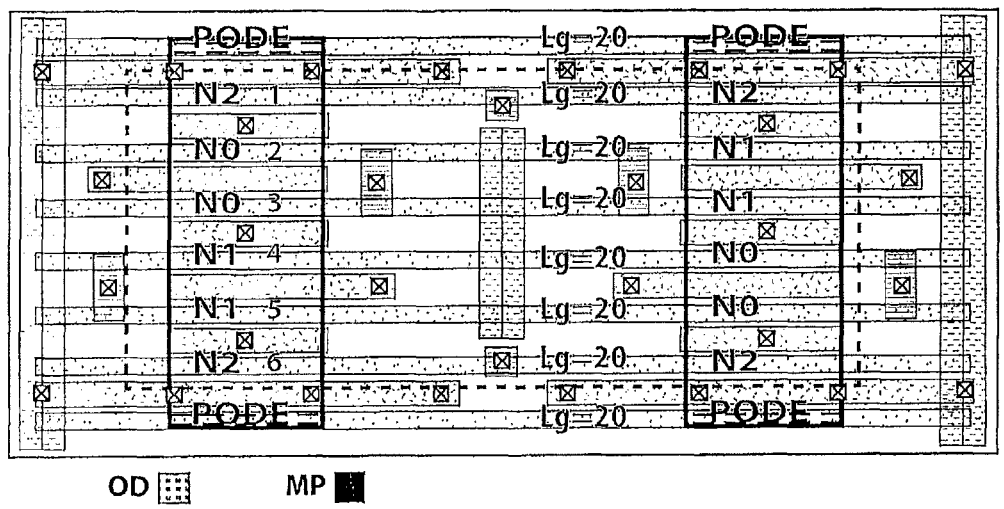

For semiconductor devices manufactured using FinFET technology, the threshold voltage (Vt) of a device/transistor varies across the layout, depending upon the placement of the device on the OD layer. FIG. 4A shows an example of threshold voltage Vt distribution across layout of sense amplifier 100 of FIG. 1. As shown by FIG. 4B, inner transistors placed near the center of the layout (e.g., at locations 2, 3, 4, and 5) can have smaller Vt variations than those edge transistors (placed near the edge of the layout e.g., at locations 1 and 6). The edge transistors (at locations 1 and 6), on the other hand, have lower Vt than those center transistors (at locations 2,3,4,5), wherein lower Vt results in higher speed of the device.

Figure 5B:
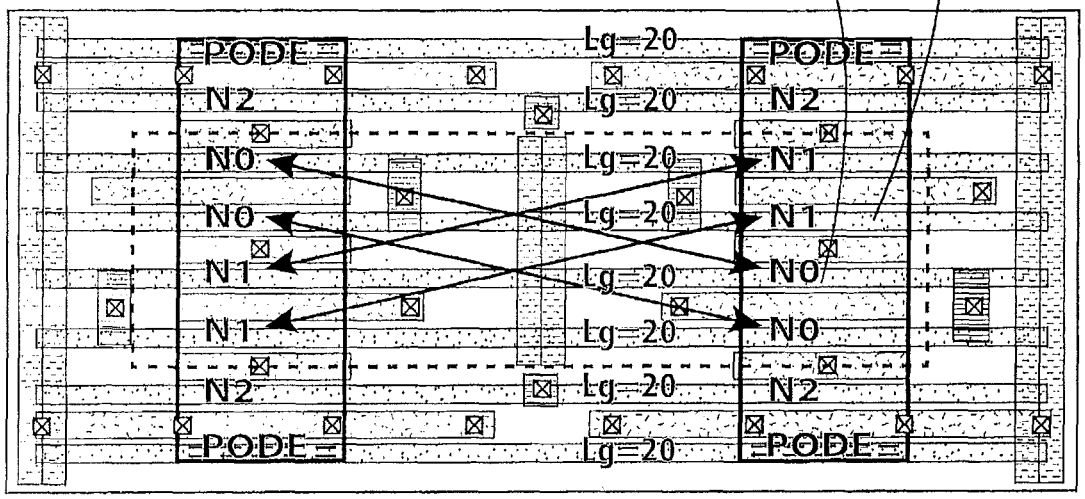

In some embodiments, in order to take advantage of Vt distribution properties of the devices depicted in FIG. 4B, the sensing devices N0 (106) and N1 (108) can be placed on or near the center area of the OD region (at locations 2, 3, 4, and 5 in FIG. 4B) as shown by the example of the plan view of the layout of the sensing devices of sense amplifier 100 in FIG. 5B. Placing the sensing devices N0 (106) and N1 (108) close to the center of the layout and far away from the edge of the OD region helps to further reduce the mismatch between the NMOS devices since Vt variations near the center of the OD region are much smaller than those near the edge of the OD region. Additionally, placing N0 (106) and N1 (108) close to the center enables other devices (e.g., N2 (110)) placed near the edge of the OD region to provide buffer protection for the source/drain terminals of N0 (106) and N1 (108).

In some embodiments, different components of the sensing devices N0 (106) and N1 (108) can be "cross-placed" (i.e., arranged horizontally) from each other in the layout of the devices. As shown by the example in FIG. 5B, components of N0 (106) can be placed in horizontal alignment with components of N1 (108). Thus, the components of sensing device N0 (106) are arranged diagonally from each other, and the components of sensing device N1 (108) are arranged diagonally from each other. Such cross-placement of components from different devices helps to further reduce the mismatch between the sensing devices N0 (106) and N1 (108) since any mismatch between components of N0 (106) and N1 (108) on one side of the layout can be compensated by a comparable mismatch between components of N0 (106) and N1 (108) on the other side of the layout.

Figure 6B:
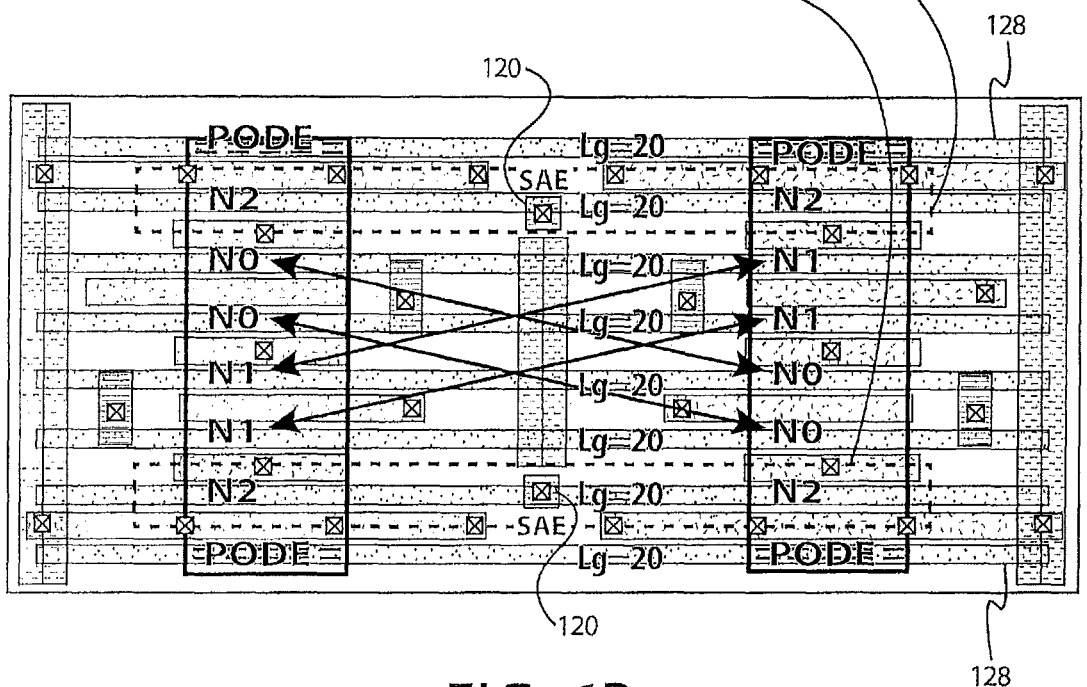

In some embodiments, SA enabling device N2 (110) is placed close to the edge of the OD region (at locations 1 and 6 in FIG. 4B) to enclose and protect sensing devices N0 (106) and N1 (108) in the layout of the sense amplifier as shown by the example of the layout of the SA enabling device of sense amplifier in FIG. 6B. Since the devices placed near the edge of the OD region have lower threshold voltage Vt than those devices placed near the center of the layout when FinFET technology is used, N2 (110) so placed discharges faster than under conventional layout, leading to higher speed of operation for sense amplifier 100. In some embodiments, a Poly on OD edge (PODE) connection 128 can to be added close to the edge of the OD region to protect the source terminal of N2 (110) as shown in FIG. 6B.

In some embodiments, since SA enabling NMOS N2 (110) are placed near the edges of the OD region enclosing sensing devices N0 (106) and N1 (108) as shown in FIG. 6, the SA enabling signal line SAE 130 can connect to gate terminal of N2 (110) by MP contacts 124 located at the center of the poly connection to N2 (110). Such layout placement of SA enabling signal SAE passing through the center of the sense amplifier 100 helps to make the SA enabling signal control more balanced for the device N2 (110) without timing skew.

Figure 7:
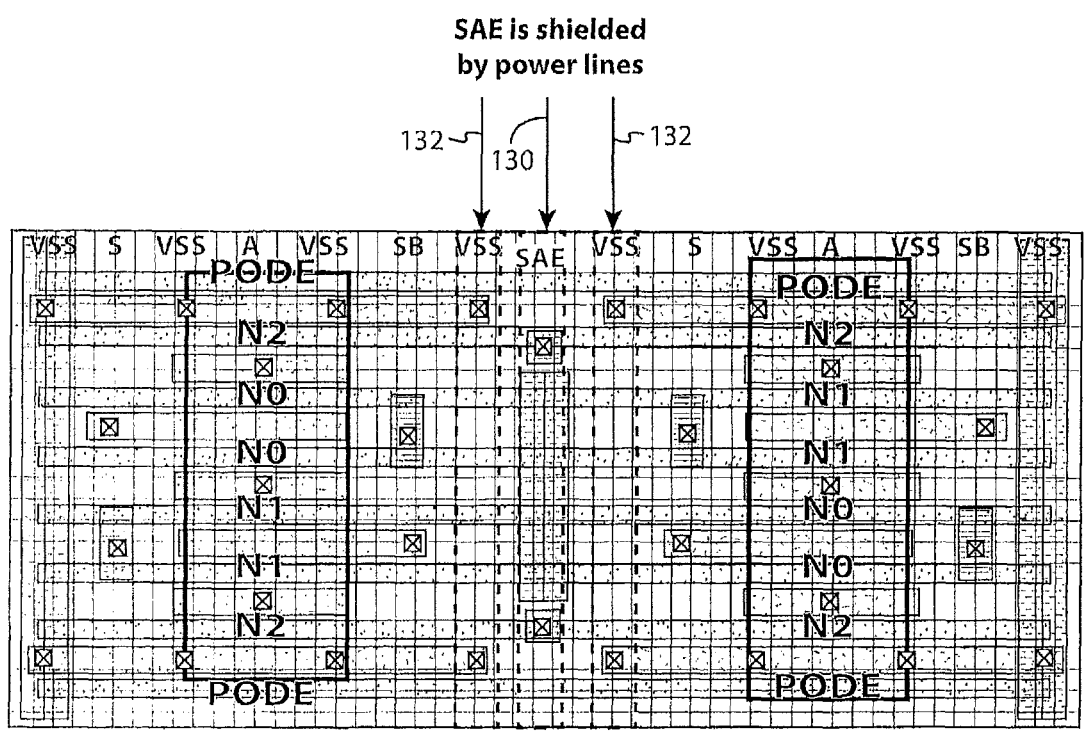
FIG. 7 shows an example of the plan view of the shielding of the SA enabling signal line of the sense amplifier.
Figure 8:
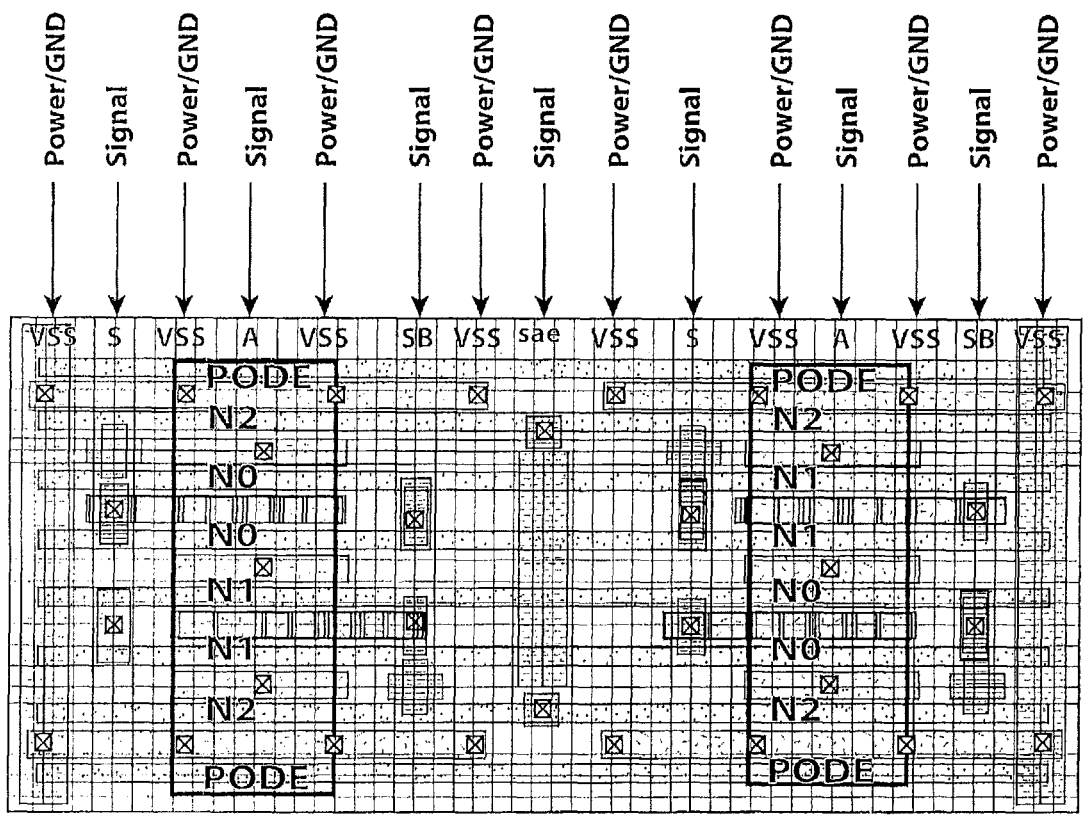
FIG. 8 shows an example of the plan view of the shielding of the signal lines of the sense amplifier.

In some embodiments, SA enabling signal line SAE 130 can be shielded by power lines 132 (such as GND, VSS, or VDD) as shown by the example of the layout of the SA enabling signal line of sense amplifier 100 in FIG. 7. Shielding of the enabling signal line SAE 130 helps to prevent any coupling issue to the internal nodes "S" and "SB" of sense amplifier 100. In some embodiments, all signal lines of sense amplifier 100—not just SA enabling signal line SAE 130—can be shielded and isolated by power/GND lines in order to avoid any mutual coupling issues as shown by the example of the layout of the sense transistor depicted in FIG. 8.

Figure 9:
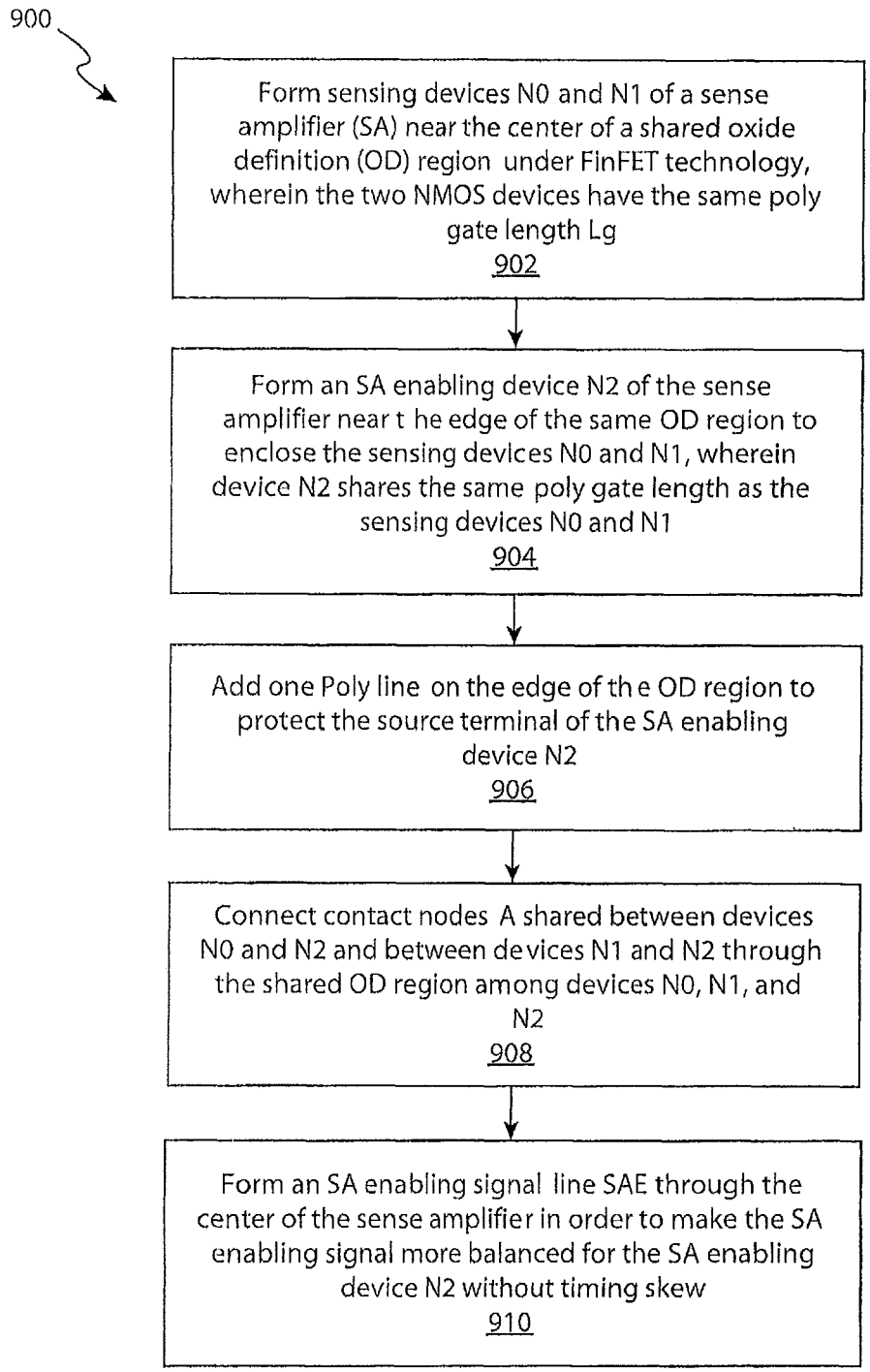
FIG. 9 is a flow chart of a method for forming a sense amplifier using FinFET technology wherein a plurality of NMOS devices in the sense amplifier share the same ploy gate length.

FIG. 9 is a flow chart 900 of a method for forming a sense amplifier using FinFET technology wherein all NMOS devices in the sense amplifier share the same poly gate length Lg.

At step 902, sensing devices N0 and N1 of a sense amplifier (SA) are formed near the center of a shared oxide definition (OD) region using FinFET technology, wherein the two NMOS devices have the same poly gate length Lg.

At step 904, an SA enabling device N2 of the sense amplifier is formed near the edge of the same OD region to enclose the sensing devices N0 and N1, wherein device N2 shares the same poly gate length as the sensing devices N0 and N1.

At step 906, one Poly line is added on the edge of the OD region to protect the source terminal of the SA enabling device N2.

At step 908, contact nodes A shared between devices N0 and N2 and between devices N1 and N2 are connected through the shared OD region among devices N0, N1, and N2.

At step 910, an SA enabling signal line SAE is formed through the center of the sense amplifier in order to make the SA enabling signal more balanced for the SA enabling device N2 without timing skew.

In some embodiments, a sense amplifier (SA) comprises a semiconductor substrate having an oxide definition (OD) region, a pair of SA sensing devices, an SA enabling device, and a sense amplifier enabling signal (SAE) line. The pair of SA sensing devices and the SA enabling device are transistors and share the same OD region. The SAE line carries an SAE signal, which when enabled, turns on the SA enabling device to discharge one of the pair of SA sensing devices for data read from the sense amplifier.

In some embodiments, the Lg of the pair of SA sensing devices is the same as the Lg of the SA enabling device.

In some embodiments, the pair of SA sensing devices and the SA enabling device are connected to a shared node through the shared OD region.

In some embodiments, the pair of SA sensing devices are placed near a center of the OD region.

In some embodiments, the SA enabling device is placed close to an edge of the OD region.

In some embodiments, the SA enabling device is arranged to provide buffer protection for source/drain terminals of the pair of SA sensing devices.

In some embodiments, a protective structure is placed close to the edge of the OD region adjacent to a source terminal of the SA enabling device.

In some embodiments, the SAE line is connected to a gate terminal of the SA enabling device through the center of the sense amplifier.

In some embodiments, the SAE line is shielded by one or more power lines.

In some embodiments, all signal lines in the sense amplifier are shielded by one or more power lines.

In some embodiments, a sense amplifier (SA) comprises a semiconductor substrate having an oxide definition (OD) region, a pair of SA sensing devices, and an SA enabling device. The pair of SA sensing devices and the SA enabling device are transistors, share the same OD layer, and have the same gate length Lg. Each of the pair of SA sensing devices and the SA enabling device are laid out in parallel in multiple components and the components of the pair of SA sensing devices are arranged diagonally with each other on the OD region.

In some embodiments, a method comprises forming an oxide definition (OD) region for a sense amplifier (SA) on a semiconductor substrate and forming a pair of SA sensing devices and an SA enabling device all on the same OD region having the same gate length Lg. The method further comprises forming a sense amplifier enabling signal (SAE) line for carrying an SAE signal to turn on the SA enabling device to discharge one of the pair of SA sensing devices for a data read from the sense amplifier.

In some embodiments, the method further comprising connecting the pair of SA sensing devices and the SA enabling device to a shared node through the shared OD region.

In some embodiments, the method further comprising placing the pair of SA sensing devices near the center of the OD region.

In some embodiments, the method further comprising placing the SA enabling device close to the edge of the OD region.

In some embodiments, the method further comprising arranging the SA enabling device so as to provide buffer protection for source/drain terminals of the pair of SA sensing devices.

In some embodiments, the method further comprising forming a protective structure close to the edge of the OD region proximate to a source terminal of the SA enabling device.

In some embodiments, the method further comprising connecting the SAE line to a gate terminal of the SA enabling device through a center of the sense amplifier.

In some embodiments, the method further comprising shielding the SAE line by one or more power lines to prevent coupling between the SAE line and an internal node of the sense amplifier.

In some embodiments, the method further comprising shielding a plurality of signal lines in the sense amplifier by one or more power lines to prevent coupling between the signal lines and one or more internal nodes of the sense amplifier.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A sense amplifier (SA), comprising:
a semiconductor substrate having a source/drain (S/D) diffusion region;
a pair of SA sensing devices both disposed in the S/D diffusion region;
an SA enabling device disposed in the same S/D diffusion region as where the pair of SA sensing devices are disposed in, wherein the pair of SA sensing devices comprises a pair of first transistors, respectively, each first transistor having a first threshold voltage and the SA enabling device comprises a second transistor having a second threshold voltage, and wherein the first threshold voltage is greater than the second threshold voltage; and
a sense amplifier enabling signal (SAE) line for carrying an SAE signal, for turning on the SA enabling device to discharge one of the pair of SA sensing devices during a data read from the sense amplifier,
wherein the pair of SA sensing devices are placed centrally in a layout of the S/D diffusion region and the SA enabling device is placed outside of the pair of SA sensing devices toward an edge of the S/D diffusion region layout.

2. The SA of claim 1, wherein:
the pair of SA sensing devices and the SA enabling device are connected to a shared node through the shared S/D diffusion region.

3. The SA of claim 1, wherein:
the SA enabling device is arranged to provide buffer protection for source/drain terminals of the pair of SA sensing devices.

4. The SA of claim 1, further comprising:
a protective structure placed close to an edge of the S/D diffusion region layout adjacent to a source terminal of the SA enabling device.

5. The SA of claim 1, wherein:
the SAE line is connected to a gate terminal of the SA enabling device through a center of the sense amplifier.

6. The SA of claim 1, wherein:
the SAE line is shielded by one or more power lines.

7. The SA of claim 1, wherein:
all signal lines in the sense amplifier are shielded by one or more power lines.

8. A sense amplifier (SA), comprising:
a semiconductor substrate having an oxide definition (OD) region;
a pair of SA sensing devices sharing the OD region; and
an SA enabling device sharing the same OD region as the pair of SA sensing devices,
wherein the pair of SA sensing devices are placed centrally in a layout of the OD region and the SA enabling device is placed outside of the pair of SA sensing devices toward an edge of the OD region layout,
wherein the SA enabling device is arranged to provide buffer protection for source/drain terminals of the pair of SA sensing devices.

9. The SA of claim 8, wherein:
the SAE line is shielded by one or more power lines.

10. The SA of claim 8, wherein:
the pair of SA sensing devices and the SA enabling device are connected to a shared node through the shared OD region.

11. The method of claim 10, further comprising:
shielding the SAE line by one or more power lines to prevent coupling between the SAE line and an internal node of the sense amplifier.

12. The method of claim 10, further comprising:
shielding a plurality of signal lines in the sense amplifier by one or more power lines to prevent coupling between the signal lines and one or more internal nodes of the sense amplifier.

13. The SA of claim 8, further comprising:
a protective structure placed close to an edge of the S/D diffusion region layout adjacent to a source terminal of the SA enabling device.

14. The SA of claim 8, wherein:
the SAE line is connected to a gate terminal of the SA enabling device through a center of the sense amplifier.

15. The SA of claim 8, wherein:
all signal lines in the sense amplifier are shielded by one or more power lines.

16. A method, comprising:
forming an oxide definition (OD) region for a sense amplifier (SA) on a semiconductor substrate;
forming a pair of SA sensing devices on the OD region;
forming an SA enabling device sharing the same OD region as the pair of SA sensing devices; and
forming a sense amplifier enabling signal (SAE) line for carrying an SAE signal to turn on the SA enabling device to discharge one of the pair of SA sensing devices for a data read from the sense amplifier,
wherein the pair of SA sensing devices are placed centrally in a layout of the OD region and the SA enabling device is placed outside of the pair of SA sensing devices toward an edge of the layout of the OD region.

17. The method of claim 16, further comprising:
connecting the pair of SA sensing devices and the SA enabling device to a shared node through the shared OD region.

18. The method of claim 17, further comprising:
arranging the SA enabling device so as to provide buffer protection for source/drain terminals of the pair of SA sensing devices.

19. The method of claim 17, further comprising:
forming a protective structure close to the edge of the OD, region proximate to a source terminal of the SA enabling device.

20. The method of claim 17, further comprising:
connecting the SAE line to a gate terminal of the SA enabling device through a center of the sense amplifier.

* * * * *